US008723504B2

(12) United States Patent
Tanisaki

(10) Patent No.: US 8,723,504 B2
(45) Date of Patent: May 13, 2014

(54) REMAINING SHEET QUANTITY DETECTION DEVICE AND IMAGE FORMING APPARATUS

(75) Inventor: Yukio Tanisaki, Osaka (JP)

(73) Assignee: Kyocera Mita Corporation (JP)

( * ) Notice: Subject to any disclaimer, the term of this patent is extended or adjusted under 35 U.S.C. 154(b) by 390 days.

(21) Appl. No.: 13/115,524

(22) Filed: May 25, 2011

(65) Prior Publication Data

US 2011/0291640 A1 Dec. 1, 2011

(30) Foreign Application Priority Data

May 28, 2010 (JP) ................................ 2010-123062

(51) Int. Cl.
*G01R 19/00* (2006.01)

(52) U.S. Cl.
USPC ........................................................ 324/76.11

(58) Field of Classification Search
USPC ........................ 271/147–157; 324/716, 76.11
See application file for complete search history.

(56) References Cited

U.S. PATENT DOCUMENTS

| | | | | |
|---|---|---|---|---|
| 7,942,413 | B2 * | 5/2011 | Eguchi | 271/279 |
| 8,061,706 | B2 * | 11/2011 | Freeston | 271/152 |
| 8,403,325 | B2 * | 3/2013 | Moriyama et al. | 271/288 |
| 2008/0277866 | A1 * | 11/2008 | Moriyama et al. | 271/279 |
| 2008/0277867 | A1 * | 11/2008 | Moriyama et al. | 271/279 |
| 2010/0148421 | A1 * | 6/2010 | Tachibana | 271/3.17 |
| 2010/0289209 | A1 * | 11/2010 | Clark et al. | 271/157 |

FOREIGN PATENT DOCUMENTS

JP 7-172623 7/1995

* cited by examiner

*Primary Examiner* — Arleen M Vazquez
*Assistant Examiner* — Alesa Allgood
(74) *Attorney, Agent, or Firm* — Gerald E. Hespos; Michael J. Porco; Matthew T. Hespos

(57) ABSTRACT

The remaining sheet quantity detection device of the present invention is provided with a storage unit for storing first information which associates a distance between a distance measuring sensor and a tray with a level value in a distance range less than a peak distance, and second information which associates the distance with the level value in a distance range exceeding the peak distance. Additionally provided is a distance acquisition unit for acquiring a distance that is associated with the level value obtained by the distance measuring sensor in the first information when a detection unit detects that the distance is less than the peak distance, and acquiring a distance that is associated with the level value obtained by the distance measuring sensor in the second information when the detection unit detects that the distance exceeds the peak distance.

14 Claims, 11 Drawing Sheets

REMAINING SHEET QUANTITY DETECTION DEVICE AND IMAGE FORMING APPARATUS

BACKGROUND OF THE INVENTION

1. Field of the Invention

The present invention relates to a device for detecting the remaining quantity of sheets by using a distance measuring sensor, and to an image forming apparatus including such a device.

2. Description of the Related Art

In a paper feeding device including a sheet setting part for setting sheets and in which the sheets on the sheet setting part are sequentially fed, there are types that are placed with a remaining sheet quantity detection device using a distance measuring sensor.

The distance measuring sensor measures the distance between itself and the sheet at the uppermost position of the sheet setting part in order to detect the remaining sheet quantity in the sheet setting part.

FIG. 10 is a diagram showing the output characteristics of the distance measuring sensor. As shown in FIG. 10, the voltage value (level value) Vout obtained by the distance measuring sensor sequentially increases as the distance L becomes longer when the distance L between the distance measuring sensor and the object to be measured is less than 2 cm. In addition, the voltage value Vout becomes the peak when the distance L is 2 cm, and when the distance L thereafter exceeds 2 cm, the voltage value Vout sequentially decreases as the distance L increases.

Based on the foregoing output characteristics, for example, when the voltage value Vout is 2.0 V, it can be seen that the distance of "1 cm" and the distance of "4 cm" are obtained as the distance corresponding to the voltage value Vout.

Meanwhile, in order for the remaining sheet quantity detection device to detect the remaining sheet quantity by using the distance measured by the distance measuring sensor, one distance needs to be set forth as the distance corresponding to the voltage value obtained by the distance measuring sensor.

Thus, with the distance measuring sensor, the distance where the voltage value Vout becomes a peak is set as the minimum detection distance its terms of its specification (2.0 cm in the case of the distance measuring sensor with the output characteristics of FIG. 10). In addition, the distance measuring sensor is disposed so that the minimum distance between the distance measuring sensor and the object to be measured exceeds the minimum detection distance so that the distance measuring sensor will not measure a distance that is less than the minimum detection distance.

FIG. 11 is a diagram showing a stocker for housing the sheets. Note that, in FIG. 11, reference numeral 331 shows the lower face of the stocker 33. With the stocker 33, a first tray 334 and a second tray 335 are filled with the predetermined maximum number of sheets SH in a state where the upper face of the tray is positioned at the lowermost position PL, and are thereafter pushed upward toward the uppermost position PH as the sheet on the upper face of the tray is ejected.

Consequently, as the sheets on the upper face of the tray are ejected, the distance between the tray upper face and the distance measuring sensors S1 and S2 will sequentially decrease toward the minimum distance L(min).

Even with this kind of stocker 33, the distance measuring sensor is disposed so that the minimum distance L(min) exceeds the minimum detection distance of the distance measuring sensor so as to obtain one distance corresponding to the voltage value obtained by the distance measuring sensors S1 and S2.

Accordingly, since the distance measuring sensor needs to be positioned so that the minimum distance between the distance measuring sensor and the object to be measured exceeds the minimum detection distance of the distance measuring sensor, there are restrictions in the positioning of the distance measuring sensor.

Moreover, since the minimum detection distance tends to become longer as the measurable distance becomes longer with a distance measuring sensor, the positioning of the distance measuring sensor becomes further restricted.

SUMMARY OF THE INVENTION

Thus, an object of this invention is to provide a remaining sheet quantity detection device capable of increasing the degree of freedom of the positioning of the distance measuring sensor, and an image forming apparatus including such a remaining sheet quantity detection device.

The remaining sheet quantity detection device according to one aspect of the present invention includes a sheet housing part for housing sheets, a tray which is provided for placing the sheets and is movable in a vertical direction within the sheet housing part, a motor for moving the tray in the vertical direction, a distance measuring sensor which is provided opposite to an upper face of the tray, outputs a measurement signal indicating a distance in the vertical direction between the distance measuring sensor and the upper face of the tray as a level value, and has output characteristics where the level value becomes a peak value when the distance is a predetermined peak distance, the level value sequentially increases as the distance increases when the distance is less than the peak distance, and the level value sequentially decreases as the distance increases when the distance exceeds the peak distance, a detection unit for detecting that the distance is less than the peak distance and that the distance exceeds the peak distance, a storage unit for storing first information which associates the distance with the level value in a distance range less than the peak distance, and second information which associates the distance with the level value in a distance range exceeding the peak distance, a distance acquisition unit for acquiring a distance that is associated with the level value obtained by the distance measuring sensor in the first information when the detection unit detects that the distance is less than the peak distance, and acquiring a distance that is associated with the level value obtained by the distance measuring sensor in the second information when the detection unit detects that the distance exceeds the peak distance, and a remaining quantity detection unit for detecting a remaining quantity of the sheets by using the distance acquired by the distance acquisition unit.

The image forming apparatus according to another aspect of the present invention includes the remaining sheet quantity detection device with the foregoing configuration, a conveyer unit for picking up and conveying the sheets housed in the sheet housing part, and an image forming unit for forming an image on the sheet conveyed by the conveyer unit.

The remaining sheet quantity detection device according to yet another aspect of the present invention is a remaining sheet quantity detection device for detecting a remaining quantity of sheets placed on a tray which is moved in an upward direction as the remaining quantity of the sheets decreases, including a distance measuring sensor which is provided opposite to a face of the tray, outputs a measurement signal indicating a distance in the vertical direction between the distance measuring sensor and the face of the tray as a level value, and has output characteristics where the level value increases as the distance increases when the distance is less than a peak distance which is the distance where the level value becomes a peak value, and the level value decreases as the distance increases when the distance exceeds the peak distance, a detection unit for detecting that the distance is less than the peak distance and that the distance exceeds the peak distance, a storage unit for storing first information which associates the distance with the level value in a distance range less than the peak distance, and second information which associates the distance with the level value in a distance range exceeding the peak distance, a distance acquisition unit which causes the distance measuring sensor to output the measurement signal by operating the distance measuring sensor in order to detect a remaining quantity of the sheets placed on the tray, (i) acquires a distance that is associated with the level value obtained by the distance measuring sensor in the first information when the detection unit detects that the distance is less than the peak distance, and (ii) acquires a distance that is associated with the level value obtained by the distance measuring sensor in the second information when the detection unit detects that the distance exceeds the peak distance, and a remaining quantity detection unit for detecting a remaining quantity of the sheets by using the distance acquired by the distance acquisition unit.

BRIEF DESCRIPTION OF THE DRAWINGS

FIG. 5A to FIG. 5C are diagrams explaining the operation where the switch is turned ON.

DETAILED DESCRIPTION OF THE PREFERRED EMBODIMENTS

Figure 1:
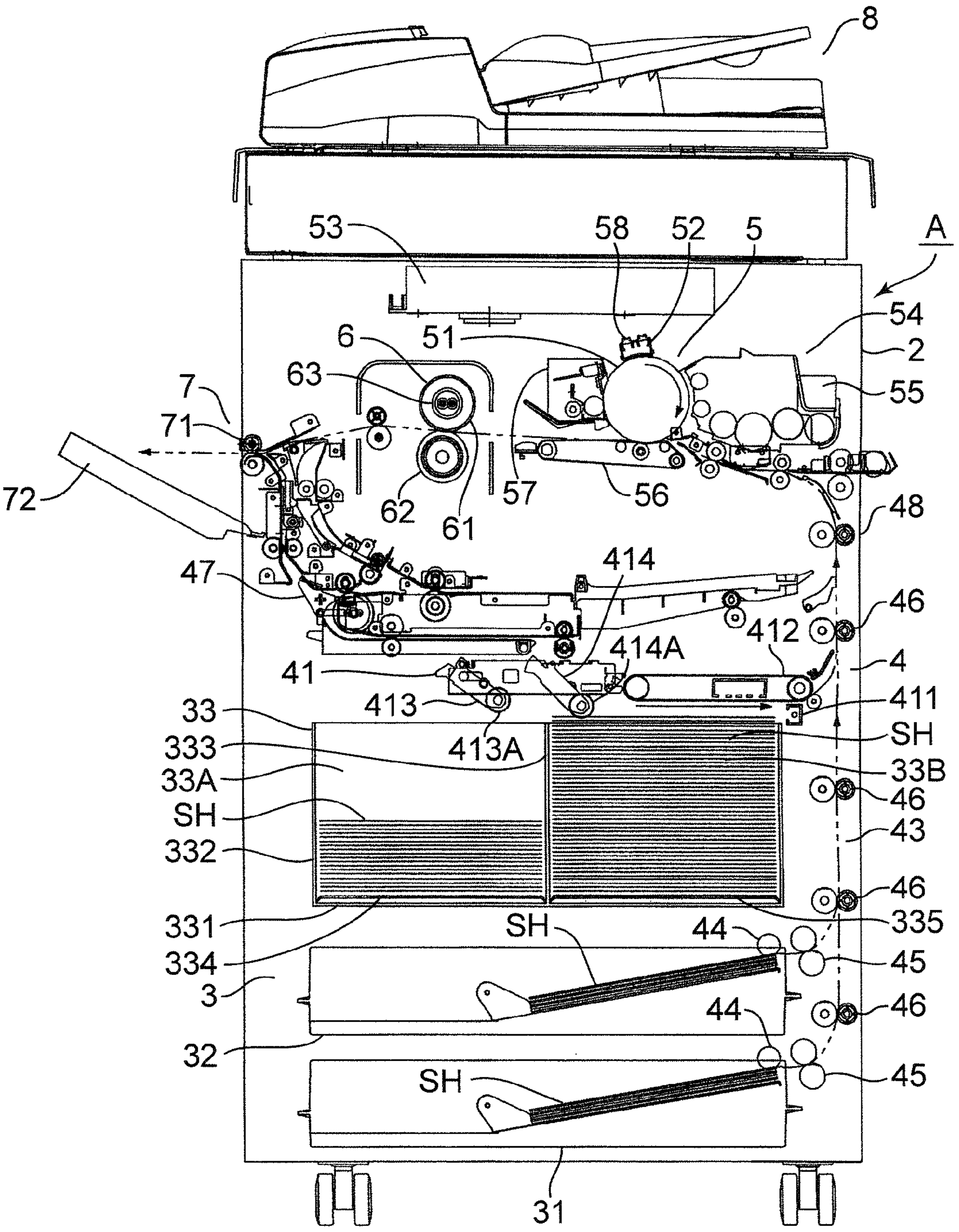
FIG. 1 is a schematic cross section showing an example of the image forming apparatus according to an embodiment of the present invention.

The remaining sheet quantity detection device and the image forming apparatus according to an embodiment of the present invention are now explained with reference to the appended drawings. FIG. 1 is a schematic cross section showing an example of the image forming apparatus according to an embodiment of the present invention. Note that the image forming apparatus shown in FIG. 1 includes the remaining sheet quantity detection device according to an embodiment of the present invention.

As shown in FIG. 1, the image forming apparatus A includes a chassis 2 formed in an approximately rectangular shape, a storage part 3 disposed at the lower part of the internal space of the chassis 2 and in which sheets SH are accumulated, a conveyer unit 4 for picking up and conveying the sheet SH from the storage part 3, an image forming unit 5 for forming a toner image on a face of the sheet SH that is being conveyed, and a fixation part 6 for fixing the toner image formed on the sheet onto the face of the sheet SH, and a discharging part 7 for discharging the sheet SH, to which the toner image has been fixed, outside the chassis 2. A manuscript reading unit 8 for reading the image of the manuscript is disposed at the upper part of the chassis 2. The manuscript reading unit 8 reads the image of the manuscript and converts it into electronic data.

The storage part 3 includes a first cartridge 31 and a second cartridge 32 for housing a bundle of a small quantity of sheets SH. The second cartridge 32 is disposed above the first cartridge 31. The storage part 3 additionally includes a stocker (sheet housing part) 33 for housing sheets SH in a quantity that is greater than the quantity that can be housed in the first cartridge 31 and the second cartridge 32. The stocker 33 is disposed above the second cartridge 32.

The stocker 33 includes an approximately rectangular plate-shaped bottom part 331, and a peripheral wall part 332 extending upward from the rim of the bottom part 331. The upper edge of the peripheral wall part 332 forms an opening of the stocker 33. The sheets SH housed in the internal space of the stocker 33 that is defined by the bottom part 331 and the peripheral wall part 332 are extracted from the conveyer unit 4 through the opening formed at the upper part of the stocker 33, and conveyed toward the image forming unit 5. The first cartridge 31, the second cartridge 32 and the stocker 33 are provided so that they can be removed from the inside of the chassis 2.

The stocker 33 includes a divider 333 that is disposed across the internal space of the stocker 33. The divider 333 extends upward from the bottom part 331, and partitions the internal space of the stocker 33 into mutually adjacent space spaces on the left and right sides in FIG. 1. The small space formed on the left side forms a first housing part 33A, and the small space formed on the right side forms a second housing part 33B.

The conveyer unit 4 includes a paper path 43 extending in the vertical direction on the right side of the storage part 3. The sheet SH that was extracted from the stocker 33 by the sheet extraction rollers 413A and 414A is conveyed to the paper path 43 by a belt device 412, and heads toward the image forming unit 5 through the paper path 43.

The sheet extraction roller 413A is provided to the first roller device 413, and the sheet extraction roller 414A is provided to the second roller device 414. The first roller device 413 and the second roller device 414 are provided rotatably relative to the chassis 2, and the angle formed between the horizontal plane of the first roller device 413 and the horizontal plane of the second roller device 414 will change as a result of the first roller device 413 and second roller device 414 being pressed upward by the sheets SH placed on the stocker 33.

When the angle formed between the horizontal plane of the first roller device 413 and the horizontal plane of the second roller device 414 becomes a pre-set angle, the drive of the motor for generating force to press the first roller device 413 and the second roller device 414 in the upward direction is stopped.

The conveyer unit 4 additionally includes a pickup roller 44 that is disposed in the vicinity of the upper right corner of the first cartridge 31 and the second cartridge 32, and a separation/paper feed roller 45 that is disposed downstream in the vicinity of the pickup roller 44. The pickup roller 44 and the separation/paper feed roller 45 extract one sheet SH at a time from the first cartridge 31 and the second cartridge 32, and convey the sheet SH to the paper path 43. The conveyer unit 4 further includes a plurality of conveyance rollers 46 disposed along the paper path 43. The conveyance rollers 46 convey the sheet SH that was fed from the stocker 33, the first cartridge 31 or the second cartridge 32 to the image forming unit 5 through the paper path 43.

The image forming unit 5 includes an approximately cylindrical photoreceptor drum 51 that is rotatably supported by the chassis 2, and a charger 52 disposed above the photoreceptor drum 51. The photoreceptor drum 51 rotates in the clockwise direction in FIG. 1. The charger 52 applies an electric charge to the photoreceptor drum 51 and uniformly charges the peripheral face of the photoreceptor drum 51. The image forming unit 5 additionally includes an exposure device 53. The exposure device 53 irradiates a laser beam to the charged peripheral face of the photoreceptor drum 51 based on the image data that was obtained by the manuscript reading unit 8 reading the image of the manuscript. Consequently, since the laser beam will cause the electrical charge on the photoreceptor drum 51 to disappear, an electrostatic latent image coinciding with the image data is formed on the photoreceptor drum 51. The image forming unit 5 further includes a developing device 54. The developing device 54 includes a toner container 55 for housing a toner, and supplies the toner from the toner container 55 to the peripheral face of the photoreceptor drum 51 formed with the electrostatic latent image thereon. A toner image coinciding with the electrostatic latent image is thereby formed on the peripheral face of the photoreceptor drum 51.

The image forming unit 5 further includes a transfer belt 56 that is disposed below the photoreceptor drum 51. The sheet SH is fed between the photoreceptor drum 51 and the transfer belt 56 through the paper path 43. When the sheet SH passes through the photoreceptor drum 51 and the transfer belt 56, the toner image formed on the peripheral face of the photoreceptor drum 51 is transferred to sheet SH based on the application of a reverse bias of a polarity that is opposite to the charge of the toner.

The image forming unit 5 additionally includes a cleaning device 57 for removing the residual toner on the peripheral face of the photoreceptor drum 51 after the toner image is transferred to the sheet SH, and a neutralization device 58 for removing the residual charge from the peripheral face of the photoreceptor drum 51 from which the residual toner was removed.

In the image forming unit 5, the sheet SH to which the toner image was transferred is delivered to the fixation part 6. The fixation part 6 includes a fixation roller 61, and a pressure roller 62 that is pressed against the fixation roller 61. A heat source 63 is disposed within the fixation roller 61, and the toner on the sheet SH passing between the fixation roller 61 and the pressure roller 62 will melt, and the toner is fixed on the sheet SH based on the pressure from the pressure roller 62. The toner image is thereby fixed on the sheet SH.

The discharge mechanism 7 includes a discharge roller 71 disposed downstream of the fixation part 6 and mounted in the vicinity of the inner wall face of the chassis 2, and a paper receiving tray 72 for receiving the sheets SH that are discharged from the discharge roller 71 to the outside of the chassis 2.

The image forming apparatus A shown in FIG. 1 includes a paper path 47 between the stocker 33 and the image forming unit 5/fixation part 6 for both side printing. The discharge roller 71 can also feed the sheets SH to the paper path 47 based on the switchback method. The paper path 47 merges immediately before a resist roller 48 disposed midway in the paper path 43. The sheet SH that passed through the paper path 47 is delivered to the image forming unit 5 by the resist roller 48, and the toner image is transferred to the face on which the tone image is not fixed within the image forming unit 5. Subsequently, the fixation unit 6 fixes the newly transferred toner image on the sheet SH. Finally, the sheet SH is discharged on the paper receiving tray 72 by the discharge roller 71.

Figure 2:
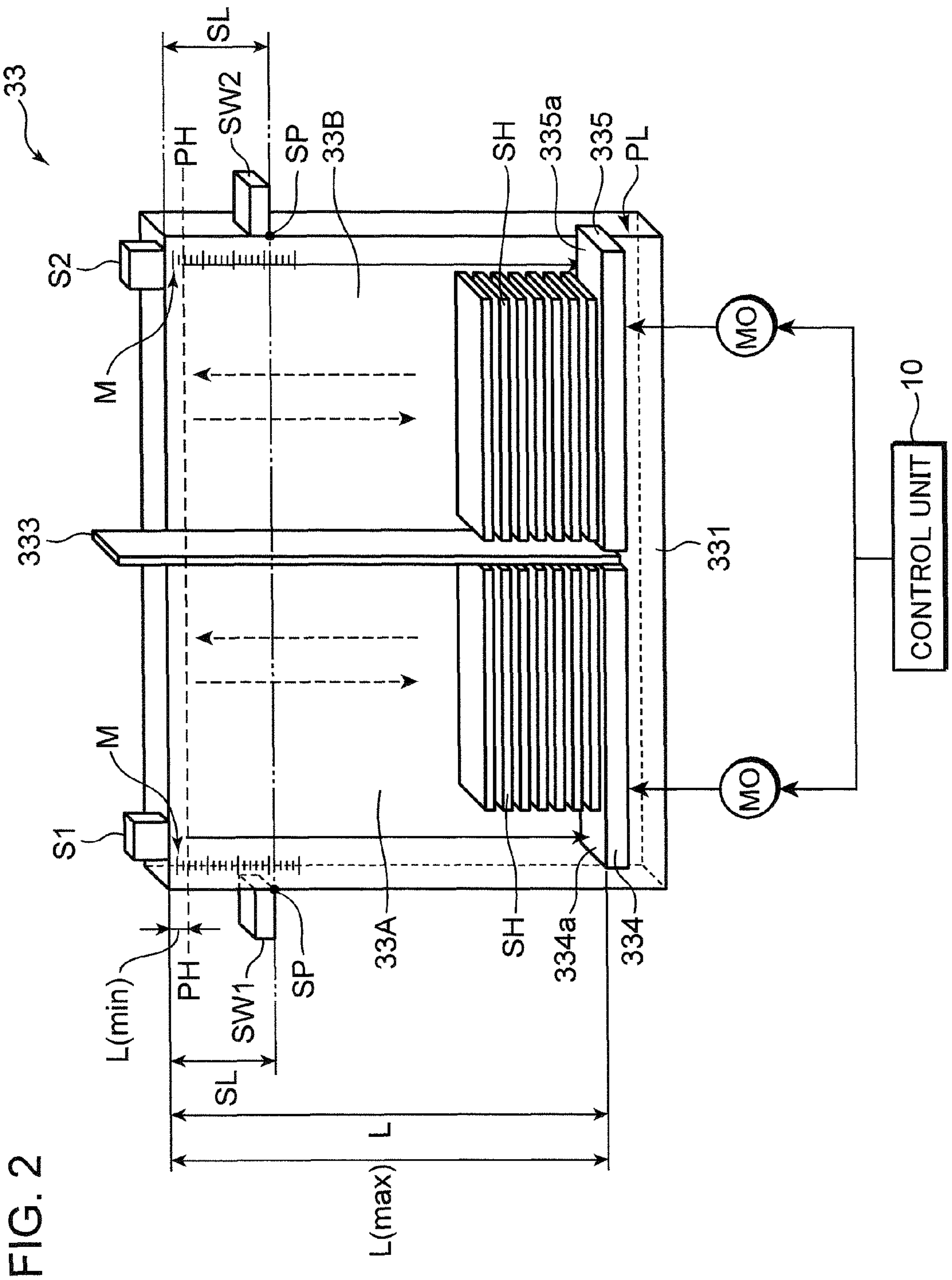
FIG. 2 is a diagram conceptually showing an example of the exterior appearance of the stocker.

FIG. 2 is a diagram conceptually showing an example of the exterior appearance of stocker 33. In FIG. 2, the same constituent elements as FIG. 1 are given the same reference numeral, and the explanation thereof is omitted.

In FIG. 2, the distance between the distance measuring sensors S1 and S2 and the first tray 334 and the second tray 335 is indicated as L. Within the distance L, the minimum distance is indicated as L(min). The minimum distance L(min) may be 0. Within the distance L, the maximum distance is indicated as L(max).

With the stocker 33 shown in FIG. 2, a first tray 334 is disposed in the first housing part 33A. A second tray 335 is disposed in the second housing part 33B. The first tray 334 includes an upper face 334*a* for placing the sheets SH. The second tray 335 also includes an upper face 335*a* for placing a bundle of the sheets SH.

The first tray 334 and the second tray 335 are configured movably in the vertical direction between a pre-set lowermost position PL and an uppermost position PH within the stocker 33.

The lowermost position PL is the position of the upper faces 334*a*, 335*a* of the trays when the first tray 334 and the second tray 335 are in contact with the bottom part 331 of the stocker 33. The uppermost position PH is the position for picking up the sheet SH of the uppermost position on the first tray 334 and the second tray 335.

The first tray 334 and the second tray 335 are driven by a motor MO, and moved in the vertical direction of the stocker 33. The motor MO is controlled and driven by the control unit 10.

In the stocker 33, a distance measuring sensor S1 for detecting the remaining quantity of the sheets SH placed on the first tray 334 is disposed at a position that is opposite to the upper face 334*a* of the first tray 334. Moreover, a distance measuring sensor S2 for detecting the remaining quantity of the sheets SH placed on the second tray 335 is disposed at a position that is opposite to the upper face 335*a* of the second tray 335.

The distance measuring sensor S1 measures the distance between the distance measuring sensor S1 and the upper face 334*a* of the first tray 334 based on the so-called triangulation method, and outputs a voltage signal (measurement signal) that is indicated with the measured distance as a voltage value (level value). Moreover, the distance measuring sensor S2 measures the distance between the distance measuring sensor S2 and the upper face 335*a* of the second tray 335 based on the so-called triangulation method, and outputs a voltage signal (measurement signal) that is indicated with the measured distance as a voltage value (level value).

The distance measuring sensors S1 and S2 have output characteristics where the voltage value is a peak value when the distance L is a peak distance SL, the voltage value sequentially increases as the distance L increases when the distance L is less than the peak distance SL, and the voltage value sequentially decreases as the distance L increases when the distance L exceeds the peak distance SL. As the foregoing output characteristics, for example, there are the output characteristics shown in FIG. 10.

Figure 10:
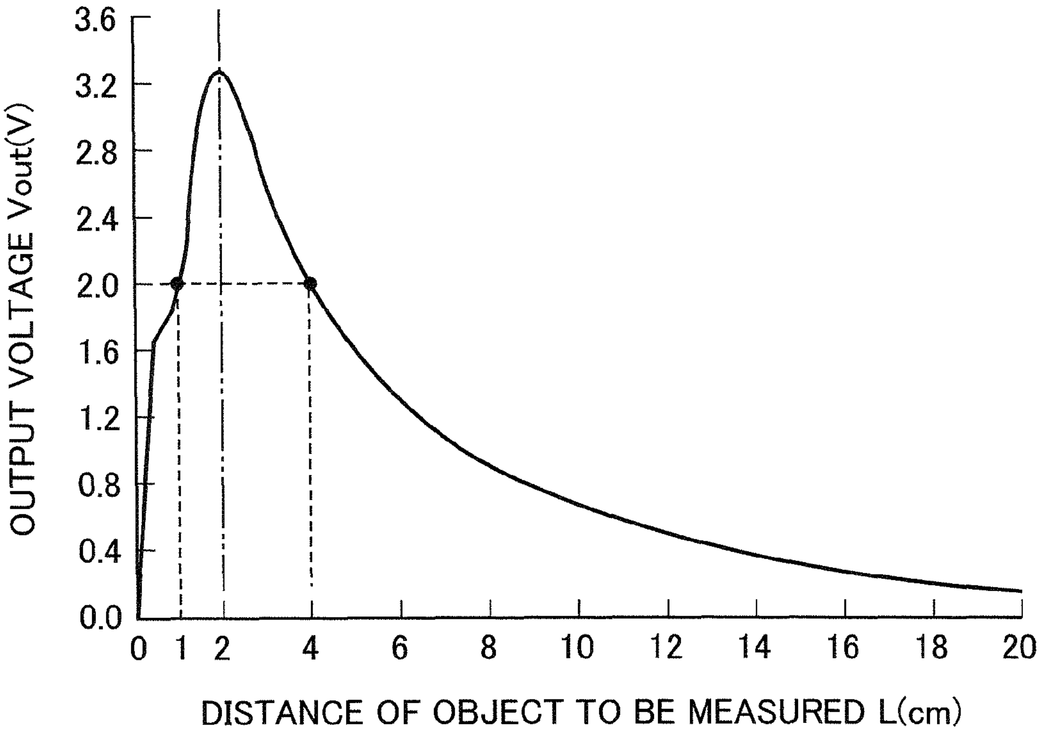
PRIOR ART FIG. 10
FIG. 10 is a diagram explaining the problems of a conventional remaining sheet quantity detection device (graph showing the output characteristics of the distance measuring sensor).
Figure 11:
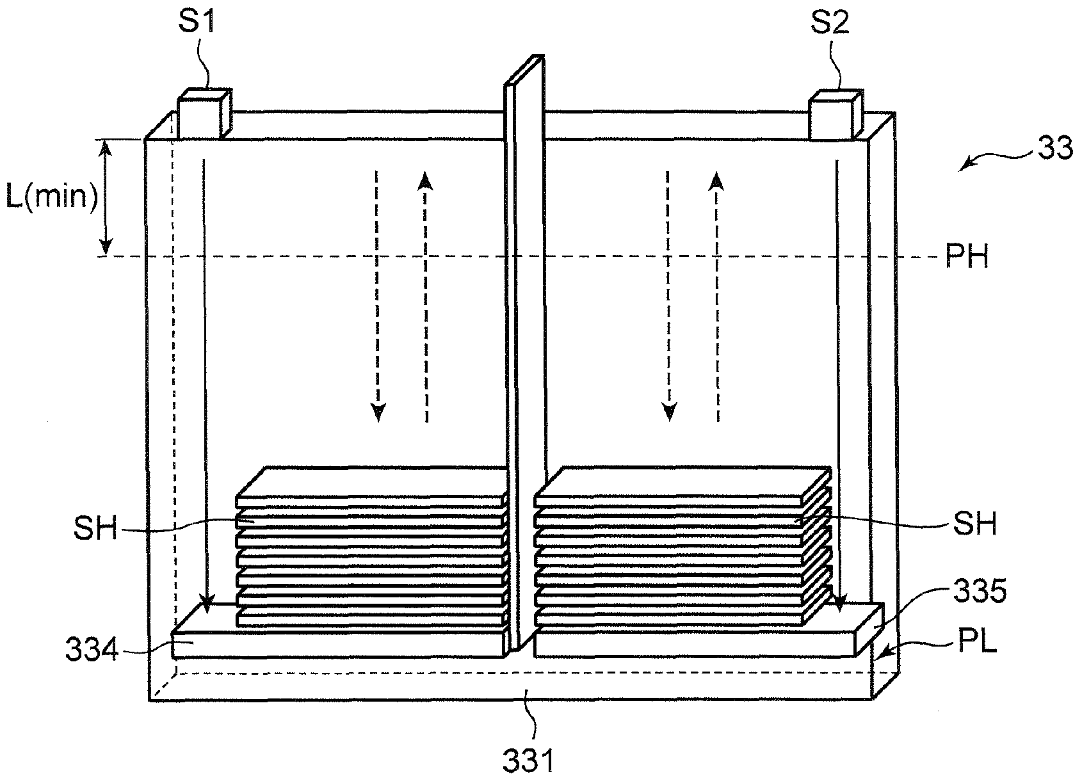
PRIOR ART FIG. 11
FIG. 11 is a diagram (external view of the stocker) explaining the problems of a conventional remaining sheet quantity detection device.

The peak distance SL is the distance L in which the voltage value obtained by the distance measuring sensors S1 and S2 becomes a peak, and the peak distance SL in which the obtained voltage value becomes a peak is defined as the minimum detection distance in the specification of the distance measuring sensors S1 and S2. In the example of FIG. 10, the peak distance SL is 2.0 cm.

Note that the distance measuring sensors S1 and S2 will suffice so as long as they can output a measurement signal of the level value according to the measured distance, and are not limited to sensor that measure the distance based on the triangulation method. Moreover, the measurement signal is not limited to a voltage signal, and may also be a current signal or a digital signal.

In other words, the distance measuring sensor S1 and S2 will suffice so as long as they have the output characteristics where the peak value is obtained when the distance between the upper faces 334*a*, 335*a* of the first tray 334 and the second tray 335 and themselves is a predetermined minimum detection distance, the output voltage value increases according to the increase in the distance in a distance range less than the minimum detection distance, and the output voltage value decreases according to the increase in the distance in a distance range exceeding the minimum detection distance.

The stocker 33 is provided with switches SW1 and SW2 at a standard position SP separated by the peak distance SL from the distance measuring sensors S1 and S2 in a vertical direction. From the perspective for the worker to easily determine the position where the switches SW1 and SW2 are to be disposed upon the manufacture of the remaining sheet quantity detection device 1, preferably, the stocker 33 is provided with a plurality of graduation marks M along the moving direction of the first tray 334 and the second tray 335 between the bottom part 331 and the distance measuring sensors S1 and S2.

With the stocker 33 configured as described above, the first tray 334 and the second tray 335 are lowered to the lowermost position PL by the motor MO and come in contact with the bottom part 331 of the stocker when a pre-set maximum number of sheets SH is placed on the upper face of the first tray 334 and the second tray 335.

Here, the uppermost sheet SH among the sheets SH placed on the upper faces 334*a*, 335*a* of the first tray 334 and the second tray 335 is positioned at the uppermost position PH. When the uppermost sheet SH is positioned at the uppermost position PH, the uppermost sheet SH comes in contact with the sheet extraction rollers 413A and 414A.

Subsequently, when the uppermost sheet SH on the first tray 334 and the second tray 335 is sequentially extracted, the number of sheets SH on the first tray 334 and the second tray 335 will decrease. Consequently, the uppermost sheet SH among the sheets SH on the first tray 334 and the second tray 335 will no longer come in contact with the sheet extraction rollers 413A and 414A.

Accordingly, as the number of sheets SH on the first tray 334 and the second tray 335 decreases, the first tray 334 and the second tray 335 are moved in the upward direction based on the driving force of the motor MO. Consequently, since the uppermost sheet SH among the sheets SH on the first tray 334 and the second tray 335 will be positioned at the uppermost position PH, even if the number of sheets SH on the first tray 334 and the second tray 335 decreases, the uppermost sheet SH can be sequentially extracted.

As described above, with the stocker 33, since the upper faces 334*a*, 335*a* of the trays are moved from the lowermost position PL toward the uppermost position PH as the number of sheets SH on the trays decreases, during the course of the foregoing movement, the distance L between the distance measuring sensors S1 and S2 and the upper face 334*a* of the first tray 334 and the upper face 335*a* of the second tray 335 decreases from the maximum distance L(max) toward the minimum distance L(min).

Moreover, during the course when the first tray 334 and the second tray 335 are moving from the lowermost position PL toward the uppermost position PH, the switches SW1 and SW2 are turned OFF when the upper faces 334*a*, 335*a* of the trays are positioned below the standard position SP, and the switches SW1 and SW2 are turned ON when the first tray 334 and the second tray 335 are positioned above the standard position SP.

In other words, the switches SW1 and SW2 are turned OFF when the distance L between the upper faces 334*a*, 335*a* of the trays and the distance measuring sensor S1, S2 is less than the peak distance SL, and the switches SW1 and SW2 are turned ON when the distance L exceeds the peak distance SL.

Figure 3:
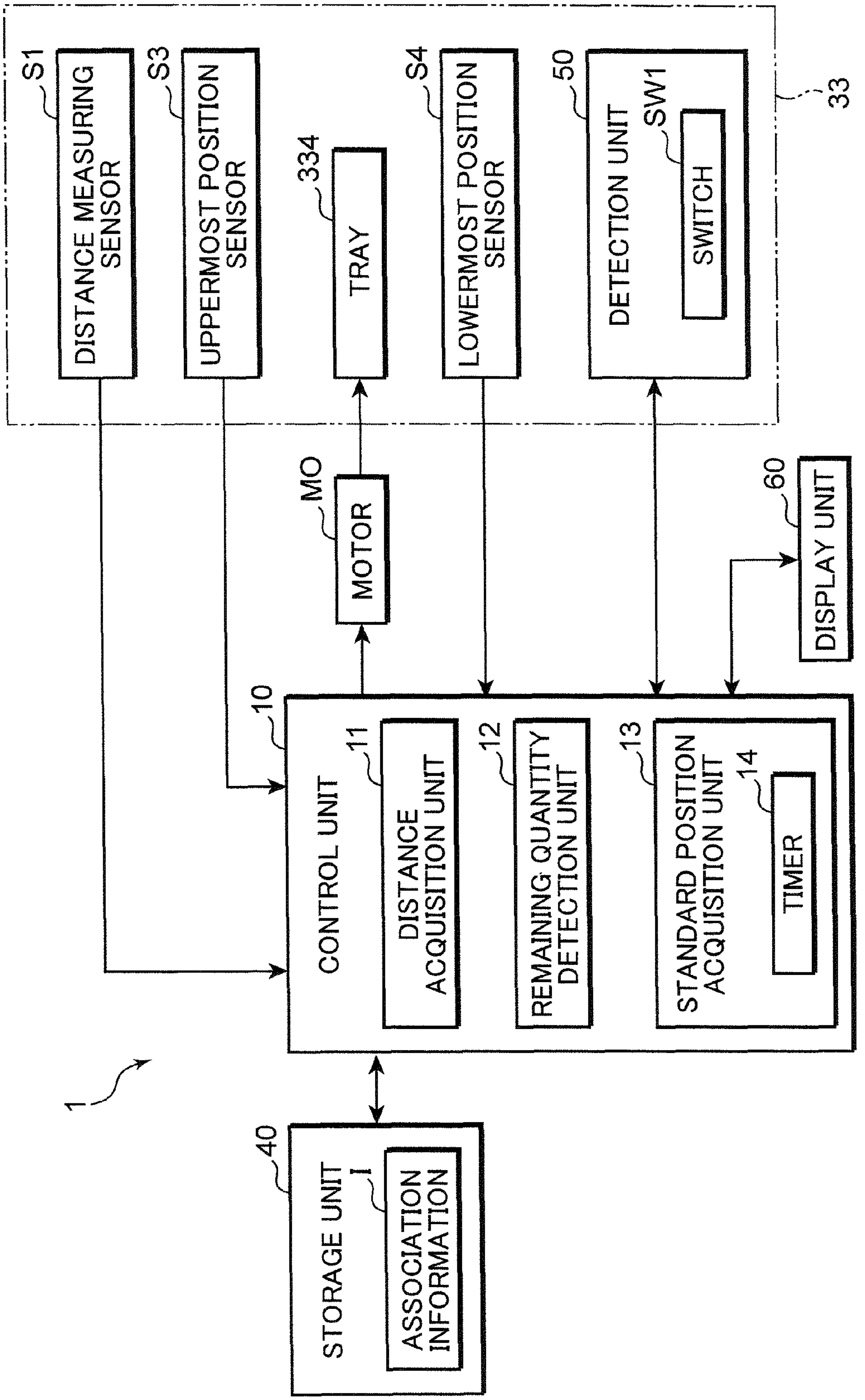
FIG. 3 is a block diagram showing an example of the functional module of the remaining sheet quantity detection device.

The remaining sheet quantity detection device 1 including the stocker 33 of FIG. 2 is now explained. FIG. 3 is a block diagram showing an example of the functional module of the remaining sheet quantity detection device 1.

In FIG. 3, since the distance measuring sensor S2, the switch SW2, and the second tray 335 are the same as the distance measuring sensor S1, the switch SW1, and the first tray 334, the explanation and illustration thereof are omitted.

The remaining sheet quantity detection device 1 includes a control unit 10, a storage unit 40, a display unit (notification unit) 60, a motor MO, and a stocker 33.

The control unit 10 is configured, for example, from a CPU, an A/D converter or the like, and governs the overall control of the remaining sheet quantity detection device 1. The control unit 10 includes a distance acquisition unit 11, a remaining quantity detection unit 12, and a standard position acquisition unit 13.

The distance acquisition unit 11 acquires a distance L corresponding to a voltage value Vout obtained by the distance measuring sensor S1. The distance acquisition unit 11 performs the distance acquisition processing described later. The remaining quantity detection unit 12 detects the remaining sheet quantity on the first tray 334 by using the distance L acquired by the distance acquisition unit 11.

The remaining quantity detection unit 12 detects the remaining sheet quantity, for example, as follows. The distance L between the upper face 334*a* of the first tray 334 and the distance measuring sensor S1 changes linearly according to the change in the remaining sheet quantity on the first tray 334. The regression line indicating the correspondence relation of the distance L and the remaining sheet quantity is stored as data in the storage unit 40.

Subsequently, the remaining quantity detection unit 12 uses the data indicating the regression line to detect the remaining sheet quantity corresponding to the distance L that was determined by the distance acquisition unit 11, and displays the detected remaining sheet quantity on a display unit (notification unit) 60.

The standard position acquisition unit 13 acquires the standard position SP. The standard position acquisition unit 13 includes a timer 14 for acquiring the standard position SP. The standard position acquisition unit 13 performs the standard position acquisition processing described later.

The storage unit 40 stores, as association information I, information indicating the output characteristics of the distance measuring sensor S1. As an example of the foregoing association information I, if the distance measuring sensor S1 has the output characteristics shown in FIG. 10, information indicating such output characteristics can be used.

Moreover, the storage unit 40 stores information indicating the ratio of the maximum distance L(max) and the time T(max) required for the first try 334 to move the maximum distance L(max) for the standard position acquisition unit 13 described later to perform the standard position acquisition processing.

Figure 4:
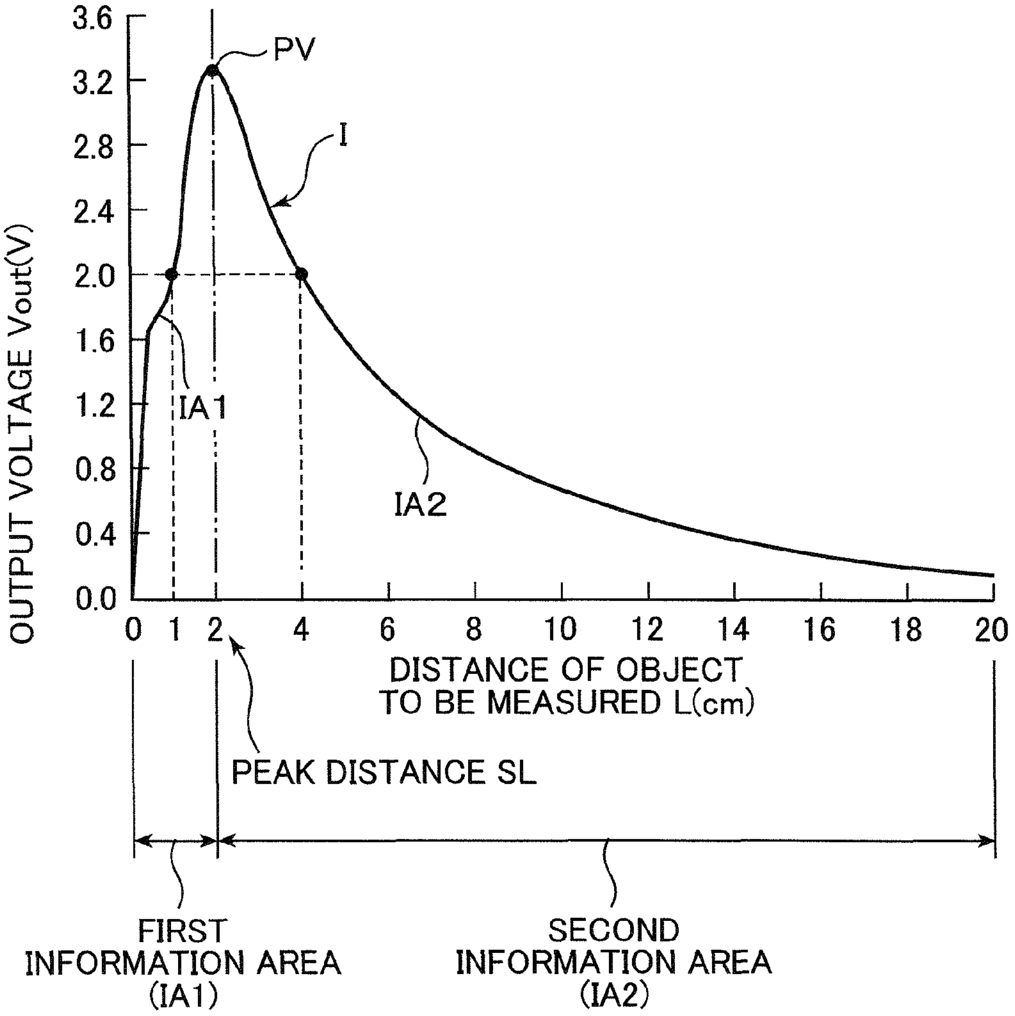
FIG. 4 is a diagram showing an example of the association information.

FIG. 4 is a diagram showing an example of the association information I. As described above, the association information I is information indicating the output characteristics of the distance measuring sensor S1. FIG. 4 shows the association information I in a case where the distance measuring sensor S1 has the output characteristics shown in FIG. 10.

The association information I shown in FIG. 4 is separated, with the peak distance SL (2.0 cm in this example) as the reference, into a first information area (first information) IA1 indicating the voltage value Vout corresponding to the distance L of a distance range less than the peak distance SL, and a second information area (second information) IA2 indicating the voltage value Vout corresponding to the distance L of a distance range exceeding the peak distance SL.

In the first information area IA1, the distance L and the voltage value Vout corresponding to the distance L are set so that the voltage value Vout sequentially increases toward the peak value PV corresponding to the peak distance SL as the distance L increases.

In the second information area IA2, the distance L and the voltage value Vout corresponding to the distance L are set so that the voltage value Vout sequentially decreases from the peak value PV as the distance L increases.

The display unit 60 is configured, for example, from a display circuit such as a liquid crystal panel, and displays the remaining sheet quantity detected by the remaining quantity detection unit 12 and the standard position SP acquired by the standard position acquisition unit 13.

The motor MO is configured, for example, from a DC motor, and moves the first tray 334 in the vertical direction within the stocker 33 by being controlled by the control unit 10.

The stocker 33 includes a detection unit 50, an uppermost position sensor S3 and a lowermost position sensor S4 in addition to the first tray 334 and the distance measuring sensor S1.

The detection unit 50 includes the foregoing switch SW1, and detects whether the distance L between the upper face 334*a* of the first tray 334 and the distance measuring sensor S1 is less than the peak distance SL or exceeds the peak distance SL. Subsequently, the detection unit 50 indicates whether the distance L is less than the peak distance SL or exceeds the peak distance SL based on the ON/OFF state of the switch SW1.

The uppermost position sensor S3 and the lowermost position sensor S4 are disposed for acquiring the standard position SP with the standard position acquisition unit 13. The uppermost position sensor S3 detects that the upper face 334*a* of the first tray 334 is positioned at the uppermost position PH and outputs a detection signal to the control unit 10. Moreover, the lowermost position sensor S4 detects that the upper face 334*a* of the first tray 334 is positioned at the lowermost position PL and outputs a detection signal to the control unit 10.

Figure 5A:
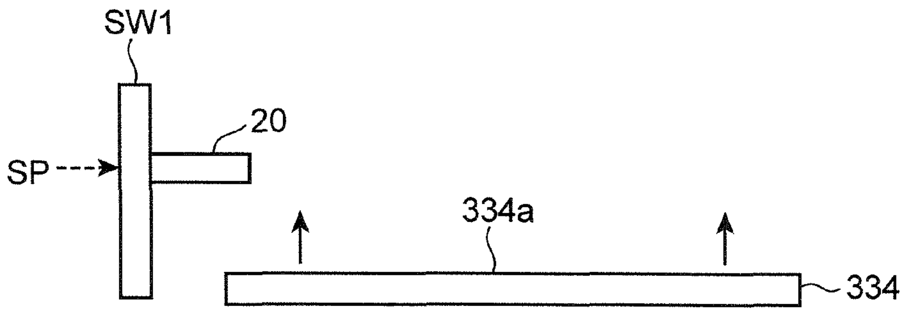
Figure 5B:
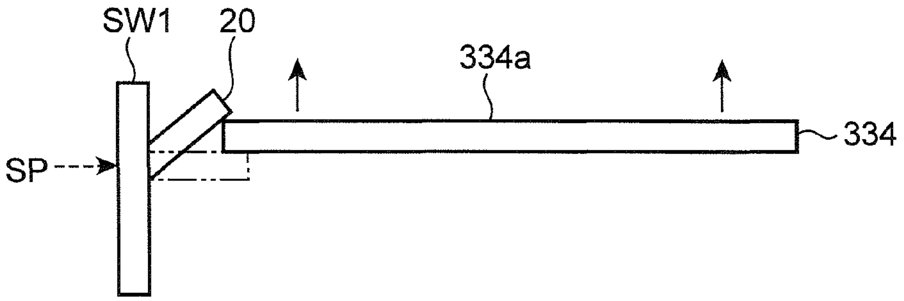
Figure 5C:
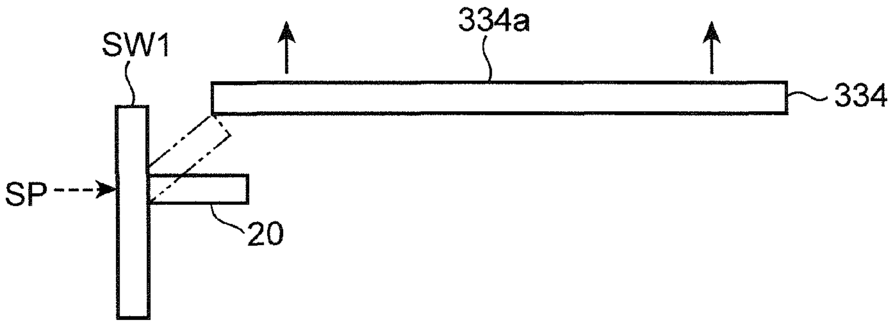
Figure 6A:
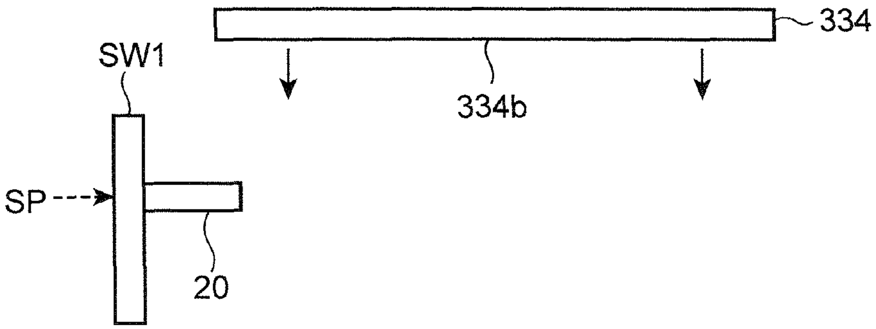
FIG. 6A to FIG. 6C are diagrams explaining the operation where the switch is turned OFF.
Figure 6B:
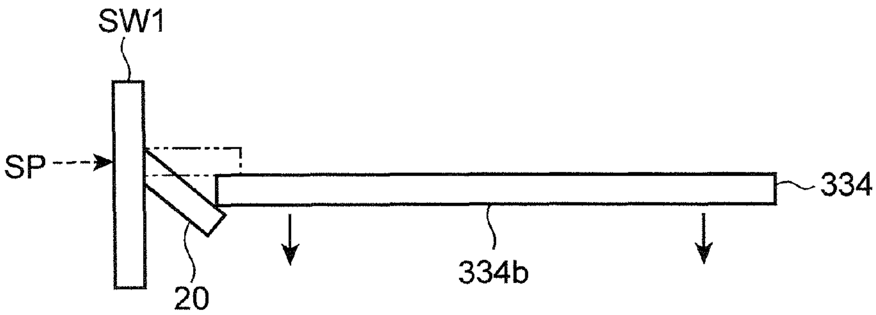
Figure 6C:
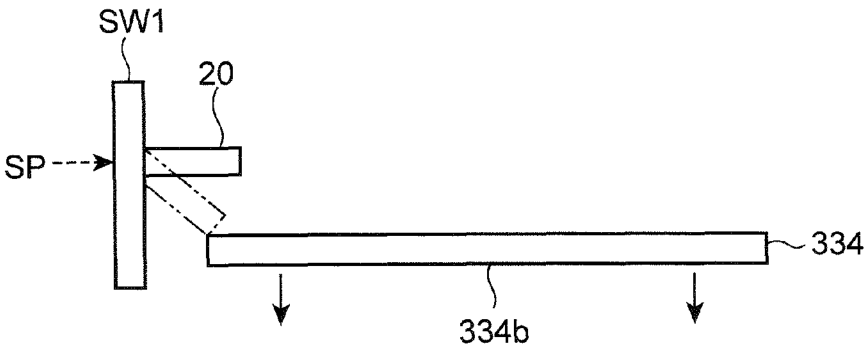

In the detection unit 50, the switch SW1 operates as follows. The operation of the switch SW1 is now explained with reference to FIG. 5A to FIG. 5C and FIG. 6A to FIG. 6C. FIG. 5A to FIG. 5C are diagrams explaining the operation where the switch SW1 is turned ON, and FIG. 6A to FIG. 6C are diagrams explaining the operation where the switch SW1 is turned OFF.

As shown in FIG. 5A to FIG. 5C, the switch SW1 is turned ON when the upper face of the first tray 334 moving in the upward direction passes through the standard position SP.

For example, as shown in FIG. 5A, let it be assumed that the first tray 334 is moving in the upward direction toward the standard position SP. When the upper face of the first tray 334 passes through the standard position SP, as shown in FIG. 5B, the upper face of the first tray 334 comes in contact with the level member 20 of the switch SW1 and the switch SW1 is turned ON as a result of the lever member 20 being jerked upward.

Subsequently, when the first tray 334 moves further in the upward direction and the upper face 334*a* of the first tray 334 becomes separated from the lever member 20 of the switch SW1, as shown in FIG. 5C, the lever member 20 returns to its original standby position. Then the switch SW1 maintains its ON state until the lever member 20 is jerked downward from the standby position.

FIG. 6A to FIG. 6C are diagrams explaining the operation where the switch SW1 is turned OFF. As shown in FIG. 6A, the switch SW1 is turned OFF when the upper face of the first tray 334 moving in the downward direction passes through the standard position SP.

For example, as shown in FIG. 6A, let it be assumed that the first tray 334 is moving in the downward direction toward the standard position SP. When the upper face 334*a* of the first tray 334 passes through the standard position SP, as shown in FIG. 6B, the lower face 334*b* of the first tray 334 comes in contact with the lever member 20 of the switch SW1, and the lever member 20 is jerked downward. The switch SW1 is thereby turned OFF.

Subsequently, when the first tray 334 moves further in the downward direction and the lower face 334*b* of the first tray 334 becomes separated from the lever member 20 of the switch SW1, as shown in FIG. 6C, the lever member 20 returns to its original standby position. Then the switch SW1 maintains its OFF state until the lever member 20 is jerked upward from the standby position.

Note that the remaining sheet quantity detection device 1 according to this embodiment uses the switch SW1 to detect whether the distance L is less than the peak distance SL or exceeding the peak distance SL. Nevertheless, the present invention is not limited to the foregoing example, and a light shielding sensor configured from a light-emitting part and a light-receiving part may be disposed at the standard position SP in order to detect whether the distance L is less than the peak distance SL or exceeding the peak distance SL.

Accordingly, the remaining sheet quantity detection device 1 according to this embodiment may include the following stocker in substitute for the stocker 33 shown in FIG. 2.

Figure 7:
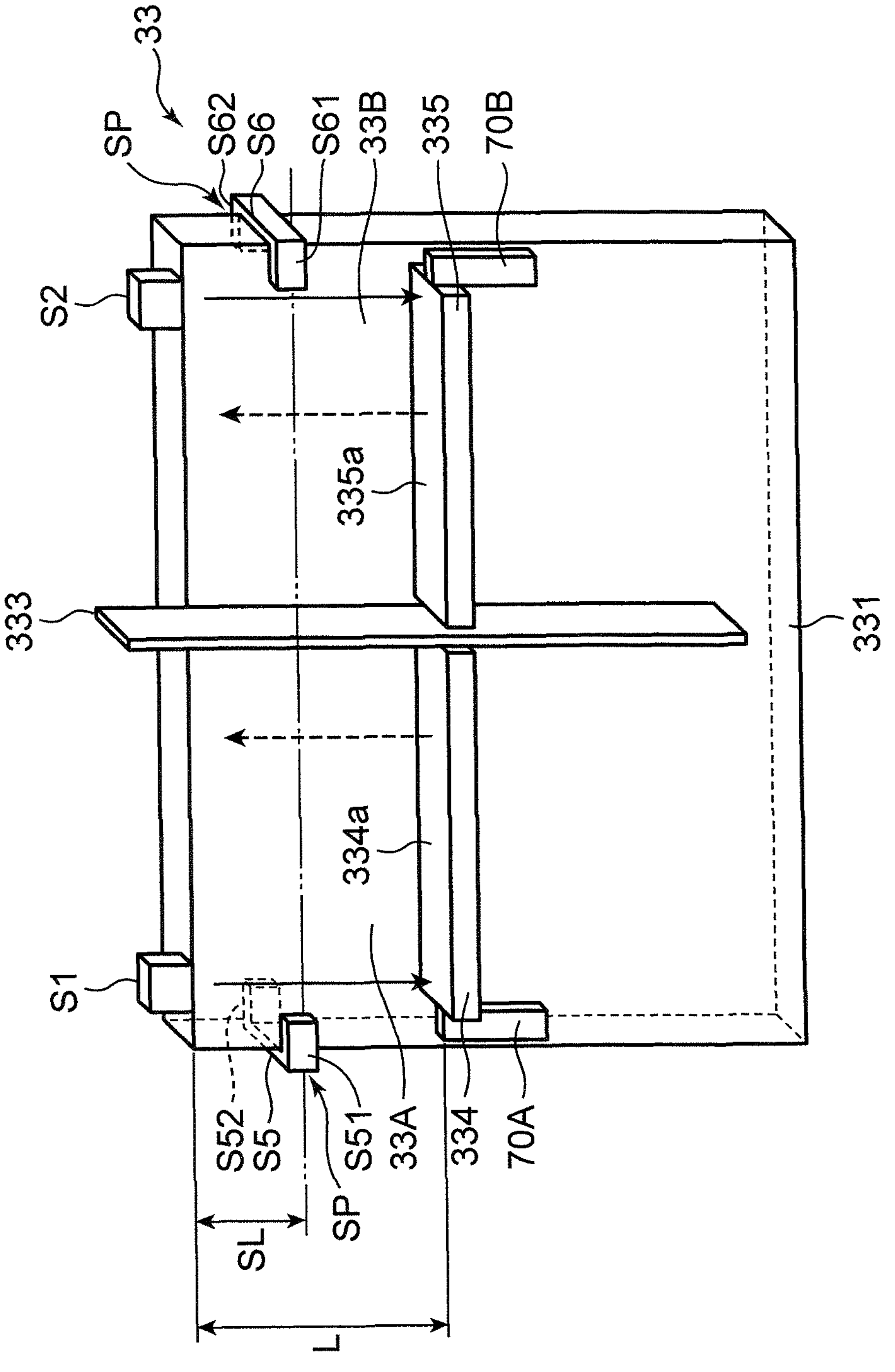
FIG. 7 is a diagram conceptually showing another example of the exterior appearance of the stocker.

FIG. 7 is a diagram conceptually showing another example of the exterior appearance of the stocker 33. The stocker 33A shown in FIG. 7 differs from the stocker 33 shown in FIG. 2 with respect to the point that light shielding sensors S5 and S6 are provided in substitute for the switches SW1 and SW2, and the point that light shielding members 70A and 70B are provided to the first tray 334 and the second tray 335.

Note that, since the remaining configuration is the same as the stocker 33 shown in FIG. 2, the explanation thereof is omitted.

The light shielding member 70A is mounted on the left end of the first tray 334 so that the upper end face of the light shielding member 70A becomes the same height as the upper face 334*a* of the first tray 334. Moreover, the light shielding member 70B is mounted on the right end of the second tray 335 so that the upper end face of the light shielding member 70B becomes the same height as the upper face 335*a* of the second tray 335.

The light shielding sensor S5 is mounted on the left end of the stocker 33. The light shielding sensor S5 is mounted so that the light that is output from the light-emitting part S51 toward the light-receiving part S52 is shielded by the light shielding member 70A. In other words, the light-emitting part S51 and the light-receiving part S52 are disposed to face each other in an area where the light shielding member 70A passes through. In the stocker 33, a hole (not shown) is formed at a location of the light-emitting part S51 and the light-receiving part S52, and the light from the light-emitting part S51 thereby reaches the light-receiving part S52.

The light shielding sensor S6 is mounted on the right end of the stocker 33. The light shielding sensor S6 is mounted so that the light that is output from the light-emitting part S61 toward the light-receiving part S62 is shielded by the light shielding member 70B. In other words, the light-emitting part S61 and the light-receiving part S62 are disposed to face each other in an area where the light shielding member 70B passes through. In the stocker 33, a hole (not shown) is formed at a location of the light-emitting part S61 and the light-receiving part S62, and the light from the light-emitting part S61 thereby reaches the light-receiving part S62.

The processing of detecting whether the distance L between the distance measuring sensor S1 and the upper face 334*a* of the first tray 334 is less than the peak distance SL or exceeding the peak distance SL is now explained. Note that, since the processing of detecting whether the distance L between the distance measuring sensor S2 and the upper face 335*a* of the second tray 335 is less than the peak distance SL or exceeding the peak distance SL is the same as the following processing, the explanation thereof is omitted.

When the upper face 334*a* of the first tray 334 is positioned below the standard position SP, in the light shielding sensor S5, light from the light-emitting part S51 is not shielded and reaches the light-receiving part S52. Here, a signal indicating that the light is not being shielded is output from the light shielding sensor S5.

Meanwhile, if the upper face 334*a* of the first tray 334 is positioned above the standard position SP, in the light shielding sensor S5, light from the light-emitting part S51 heading toward the light-receiving part S52 is shielded by the light shielding member 70A. Here, a signal indicating the light is being shielded is output from the light shielding sensor S5.

Accordingly, when the distance L between the upper face 334*a* of the first tray 334 and the distance measuring sensor S1 is less than the peak distance SL, a signal indicating that light is being shielded is output from the light shielding sensor S5, and, when the distance L is exceeding the peak distance SL, a signal indicating that light is not being shielded is output from the light shielding sensor S5.

It is thereby possible to detect whether the distance L is less than the peak distance SL or exceeding the peak distance SL.

Figure 8:
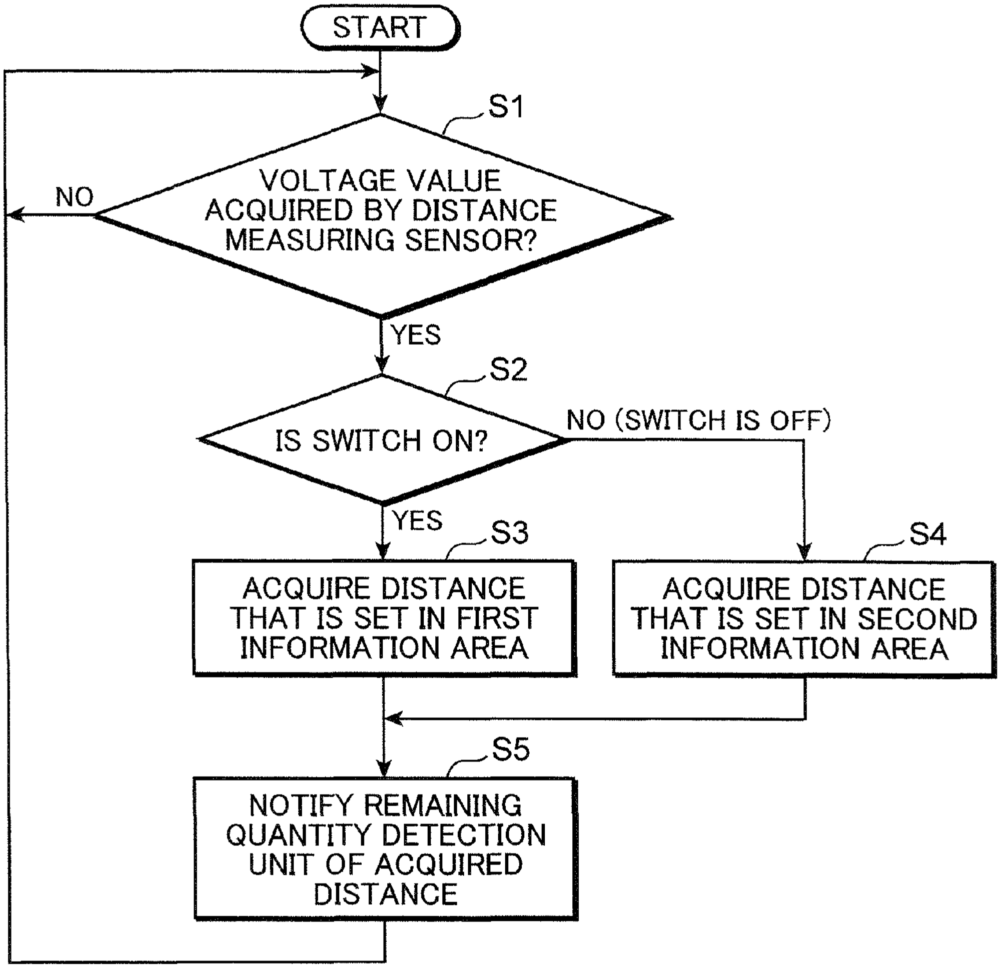
FIG. 8 is a flowchart showing an example of the outline of the distance determination processing.

With the remaining sheet quantity detection device 1 according to this embodiment, the distance acquisition unit 11 performs the distance determination processing for determining the distance L, for example, as follows. FIG. 8 is a flowchart showing an example of the outline of the distance determination processing.

In the image forming apparatus A shown in FIG. 1, when the stocker 33 feeds the sheet SH and the image forming unit 5 completes the job for forming an image on the sheet SH, the distance acquisition unit 11 operates the distance measuring sensor S1 and causes the distance measuring sensor S1 to outputs a measurement signal (voltage value Vout). Specifically, the distance measuring sensor S1 irradiates an infrared and outputs a measurement signal by receiving the infrared that was reflected off the upper face 334*a* of the first tray 334.

When the distance acquisition unit 11 acquires the voltage value Vout obtained by the distance measuring sensor S1 (step S1), it determines the ON/OFF state of the switch SW1 (step S2).

In step S2, when the distance acquisition unit 11 determines that the switch SW1 is ON (YES in step S2), the distance acquisition unit 11 acquires the distance L that is set in correspondence with the voltage value Vout acquired in step S1 in the first information area IA1 of the association information I (step S3).

Meanwhile, when the distance acquisition unit 11 determines that the step SW1 is OFF (NO in step S2), the distance acquisition unit 11 acquires the distance L that is set in correspondence with the voltage value Vout acquired in step S1 in the second information area IA2 of the association information I (step S4).

Subsequently, the distance acquisition unit 11 notifies the remaining quantity detection unit 12 of the distance L acquired in step S3 or step S4 (step S5).

According to the remaining sheet quantity detection device of this embodiment, as described above, one distance L of the two distances L corresponding to the voltage value Vout obtained with the distance measuring sensor S1 is acquired according to whether the distance L is less than the peak distance SL or exceeding the peak distance SL.

Consequently, one distance L corresponding to the voltage value Vout obtained by the distance measuring sensor S1 is determined even when the distance measuring sensor S1 is disposed so that the minimum distance L(min) between the distance measuring sensor S1 and the upper face 334*a* of the first tray 334 is less than the peak distance SL.

Since it is thereby possible to dispose the distance measuring sensor S1 without having to give consideration to the minimum detection distance that is set in advance by the distance measuring sensor S1, the degree of freedom of the positioning of the distance measuring sensor S1 can be improved.

Moreover, according to this embodiment, when the detection unit 50 detects that the distance L is less than the peak distance SL, the distance acquisition unit 11 acquires the distance that is associated with the level value obtained by the distance measuring sensor S1 in the first information, and detects the remaining quantity detection unit 12 detects the remaining quantity of the sheets SH based on the foregoing distance. Accordingly, when a bundle of the sheets SH is placed on the first tray 334 shown in FIG. 2, the sheets SH can also be positioned in the space from the uppermost position PH to the peak distance SL, and it is possible to prevent such space from becoming a dead space.

Note that, in the foregoing embodiment, the distance L being less than the peak distance SL is indicated by the switch SW1 being turned ON and the distance L exceeding the peak distance SL is indicated by the switch SW1 being turned OFF, but without limitation to the foregoing example, the distance L being less than the peak distance SL can be indicated by the switch SW1 being turned OFF and the distance L exceeding the peak distance SL can be indicated by the switch SW1 being turned ON.

Figure 9:
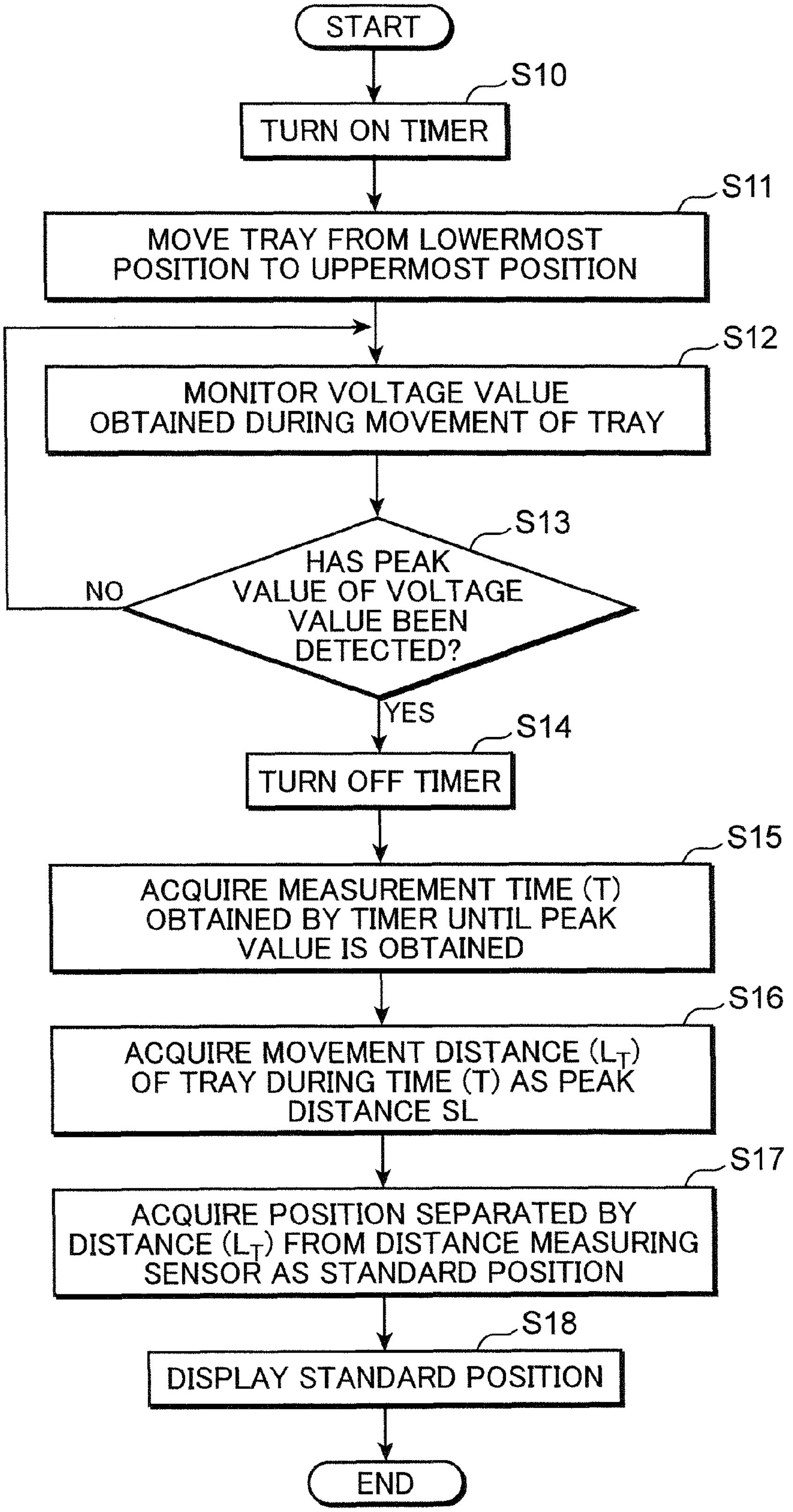
FIG. 9 is a flowchart showing an example of the outline of the standard position acquisition processing.

Moreover, with the remaining sheet quantity detection device 1 according to this embodiment, the standard position acquisition unit 13 performs the standard position acquisition processing for acquiring the standard position SP, for example, as follows. FIG. 9 is a flowchart showing an example of the outline of the standard position acquisition processing.

In the ensuing explanation, the standard position acquisition unit 13 acquires the peak value PV of the voltage value Vout that is obtained by the distance measuring sensor S1 in the course of the movement of the first tray 334, and acquires the standard position SP by using the time T up to when the peak value PV is obtained.

Note that, since the processing of acquiring the peak value of the voltage value obtained by the distance measuring sensor S2 in the course of the movement of the second tray 335 and acquiring the standard position by using the time up to when the peak value is obtained is the same as the following processing, the explanation thereof is omitted.

The standard position acquisition unit 13 foremost turns ON the timer 14 and starts measuring the time (step S10). Subsequently, the standard position acquisition unit 13 raises the first tray 334 from the lowermost position PL toward the uppermost position PH at a pre-set speed (step S11).

In order to raise the first tray 334 at a constant speed, it is preferable that the first tray 334 is not placed with the sheets SH. Moreover, whether the upper face 334*a* of the first tray 334 is positioned at the lowermost position PL can be determined by receiving a detection signal that is output from the lowermost position sensor S4.

Subsequently, the standard position acquisition unit 13 monitors the voltage value Vout obtained by the distance measuring sensor S1 during the period that the first tray 334 is moved from the lowermost position PL and reaches the uppermost position PH (step S12). Whether the upper face 334*a* of the first tray 334 is positioned at the uppermost position PH can be determined by receiving a detection signal that is output from the uppermost position sensor S3.

Next, the standard position acquisition unit 13 detects the peak value PV of the monitored voltage value Vout (step S13).

Here, the standard position acquisition unit 13 acquires the peak value PV, for example, as follows. This is now explained with reference to FIG. 2 and FIG. 4.

When the first tray 334 moves from the lowermost position PL toward the uppermost position PH, the distance L sequentially decreases from the distance L corresponding to the lowermost position PL; that is, the distance L(max) in FIG. 2 to the distance corresponding to the uppermost position PH; that is, the distance L(min) in FIG. 2.

In the course where the distance L sequentially decreases as described above, as shown in FIG. 4, the voltage value Vout obtained by the distance measuring sensor S1 sequentially increases (refer to FIG. 4) as the distance L decreases while the distance L is greater than the peak distance SL (for example, 2.0 cm in FIG. 4). Subsequently, when the distance L becomes smaller than the peak distance SL, the voltage value Vout sequentially decreases as the distance L decreases (refer to FIG. 4).

Since the distance measuring sensor S1 has the foregoing output characteristics, the standard position acquisition unit 13 acquires, as the peak value PV, the voltage value Vout when the change of the voltage value Vout shifts from an increase to a decrease.

When the standard position acquisition unit 13 acquires the peak value PV (YES in step S13), it turns OFF the timer 14 (step S14), and acquires the time T that was measured by the timer until the peak value PV is acquired (step S15). When the control unit 10 receives a detection signal that is output from the uppermost position sensor S3 as a result of the upper face 334*a* of the first tray 334 reaching the uppermost position PH, the control unit 10 performs control to stop the motor MO and stops the raising of the first tray 334.

Subsequently, the standard position acquisition unit 13 acquires, as the peak distance SL, the distance $L_T$ that the first tray 334 moved during the time T acquired in step S15 (step S16). The standard position acquisition unit 13 acquires a distance $L_T$ in which, for example, the ratio of the distance $L_T$ and the time T becomes equal to the ratio of the maximum distance L(max) and the time T(max) which is required for the first tray 334 to move the maximum distance L(max).

Specifically, the standard position acquisition unit 13 obtains the distance $L_T$ by calculating the formula represented by distance $L_T$:time T=distance L (max):time T(max).

Next, the standard position acquisition unit 13 acquires, as the standard position SP, a position separated from the distance measuring sensor S1 by the distance $L_T$; that is, by the peak distance SL (step S17), and displays the acquired standard position SP on the display unit 60 (step S18).

In step S18, the standard position acquisition unit 13 provides notification, for example, of the distance; that is, the peak distance SL by which the standard position SP is separated from the distance measuring sensor S1 in the vertical direction of the stocker 33.

According to the remaining sheet quantity detection device 1 of this embodiment, since the standard position acquisition unit acquires the standard position SP by actually measuring the peak value PV of the voltage value Vout, an appropriate standard position SP according to the distance measuring sensor S1 can be acquired even when the characteristics of the distance measuring sensor S1; that is, even when the correspondence relation of the voltage value Vout obtained by the distance measuring sensor S1 and the distance L corresponding to such voltage value Vout are different.

Moreover, since the acquired standard position SP is displayed, it is easy to know the position where the switch SW1 should be mounted during the manufacture of the remaining sheet quantity detection device 1.

Note that, the remaining sheet quantity detection device 1 according to this embodiment detects the remaining sheet quantity by acquiring the distance L which decreases as the remaining sheet quantity on the first tray 334 decreases, but without limitation to the foregoing example, the first tray 334 may be disposed in a fixed manner, and the remaining sheet quantity may also be detected by acquiring the distance between the distance measuring sensor S1 and the sheet SH of the uppermost position on the first tray 334 which increases as the remaining sheet quantity on the first tray 334 decreases.

The foregoing embodiment explained a case where, as shown in FIG. 2 and FIG. 7, the distance measuring sensor S1 faces the upper face 334*a* of the first tray 334 and the distance measuring sensor S2 faces the upper face 335*a* of the second tray 335. Nevertheless, this embodiment can also be applied in cases where the distance measuring sensor S1 faces the lower face of the first tray 334 and the distance measuring sensor S2 faces the lower face of the second tray 335.

Note that the foregoing embodiment mainly includes the invention having the following configuration.

(1) The remaining sheet quantity detection device according to one aspect of the present invention includes a sheet housing part for housing sheets, a tray which is provided for placing the sheets and is movable in a vertical direction within the sheet housing part, a motor for moving the tray in the vertical direction, a distance measuring sensor which is provided opposite to an upper face of the tray, outputs a measurement signal indicating a distance in the vertical direction between the distance measuring sensor and the upper face of the tray as a level value, and has output characteristics where the level value becomes a peak value when the distance is a predetermined peak distance, the level value sequentially increases as the distance increases when the distance is less than the peak distance, and the level value sequentially decreases as the distance increases when the distance exceeds the peak distance, a detection unit for detecting that the distance is less than the peak distance and that the distance exceeds the peak distance, a storage unit for storing first information which associates the distance with the level value in a distance range less than the peak distance, and second information which associates the distance with the level value in a distance range exceeding the peak distance, a distance acquisition unit for acquiring a distance that is associated with the level value obtained by the distance measuring sensor in the first information when the detection unit detects that the distance is less than the peak distance, and acquiring a distance that is associated with the level value obtained by the distance measuring sensor in the second information when the detection unit detects that the distance exceeds the peak distance, and a remaining quantity detection unit for detecting a remaining quantity of the sheets by using the distance acquired by the distance acquisition unit.

According to the foregoing configuration, when the detection unit detects that the distance between the distance measuring sensor and the tray upper face is less than the peak distance, distance associated with the level value obtained by the distance measuring sensor in the first information corresponding to the distance range in which the range of the foregoing distance is less than the peak range is acquired.

Meanwhile, when the detection unit detects that the distance between the distance measuring sensor and the tray upper face exceeds the peak distance, distance associated with the level value obtained by the distance measuring sensor in the second information corresponding to the distance range in which the range of the foregoing distance exceeds the peak range is acquired.

Consequently, one distance corresponding to the level value obtained by the distance measuring sensor is determined even when the distance measuring sensor is disposed so that the minimum distance between the distance measuring sensor and the upper face of the tray is less than the peak distance.

Since it is thereby possible to dispose the distance measuring sensor without having to give consideration to the minimum detection distance of the distance measuring sensor, the degree of freedom of the positioning of the distance measuring sensor can be improved.

Furthermore, since the distance measuring sensor can be disposed without having to give consideration to the minimum detection distance, the size of the sheet housing part can be reduced, and, consequently, the size of the remaining sheet quantity detection device can be reduced.

(2) In the configuration of (1) above, the detection unit includes a switch that is disposed at a standard position, which is a position separated by the peak distance from the distance measuring sensor in the vertical direction, the switch being operated when the tray passes the standard position, and whether the distance is less than the peak distance or exceeds the peak distance is indicated by an ON/OFF state of the switch.

According to the foregoing configuration, whether the distance between the distance measuring sensor and the upper face of the tray is less than the peak distance or exceeds the peak distance is indicated by the ON/OFF state of the switch.

Accordingly, it is easy to know whether the distance between the distance measuring sensor and the upper face of the tray is less than the peak distance or exceeds the peak distance.

(3) In the foregoing configuration (2), the remaining sheet quantity detection device further includes a standard position acquisition unit for acquiring the standard position, and the standard position acquisition unit drives the motor to move the tray from a lowermost position that is pre-set within the sheet housing part to an uppermost position that is pre-set within the sheet housing part at a pre-set speed, measures a time from the start of this movement until the peak value is obtained by the distance measuring sensor, and acquires the standard position by using the time thus measured.

According to the foregoing configuration, the motor is driven to move the tray from a lowermost position that is pre-set within the sheet housing part to an uppermost position that is pre-set within the sheet part at a pre-set speed, measure the time from the start of movement until the peak value is obtained by the distance measuring sensor, and acquire the standard position by using the time.

Consequently, an appropriate standard position according to the distance measuring sensor can be acquired even when the characteristics of the distance measuring sensor; for example, the output characteristics of the distance measuring sensor are different due to an output variation; that is, even when the correspondence relation of the level value obtained by the distance measuring sensor and the distance corresponding to such level value are different.

(4) In the foregoing configuration (3), the remaining sheet quantity detection device further includes a notification unit for providing notification of the standard position acquired by the standard position acquisition unit.

According to the foregoing configuration, since notification of the standard position acquired by the standard position acquisition unit is provided, it is easy to know where to dispose the switch.

(5) In the foregoing configuration (2), the sheet housing part is provided with a plurality of graduation marks between a bottom part of the sheet housing part and the distance measuring sensor in the moving direction of the tray.

According to the foregoing configuration, since the sheet housing part is provided with a plurality of graduation marks between a bottom part of the sheet housing part and the distance measuring sensor in the moving direction of the tray, it is easy to know where the standard position, which is a position separated by the peak distance from the distance measuring sensor, is located during the manufacture of the remaining sheet quantity detection device.

6) The image forming apparatus according to another aspect of the present invention includes the foregoing remaining sheet quantity detection device, a conveyer unit for picking up and conveying the sheets housed in the sheet housing part, and an image forming unit for forming an image on the sheet conveyed by the conveyer unit.

According to the foregoing configuration, since the image forming apparatus includes the remaining sheet quantity detection device of (1) to (5) above, it is possible to provide an image forming apparatus that yields the effect of the foregoing remaining sheet quantity detection device.

(7) The remaining sheet quantity detection device according to yet another aspect of the present invention is a remaining sheet quantity detection device for detecting a remaining quantity of sheets placed on a tray which is moved in an upward direction as the remaining quantity of the sheets decreases, including a distance measuring sensor which is provided opposite to a face of the tray, outputs a measurement signal indicating a distance in the vertical direction between the distance measuring sensor and the face of the tray as a level value, and has output characteristics where the level value increases as the distance increases when the distance is less than a peak distance which is the distance where the level value becomes a peak value, and the level value decreases as the distance increases when the distance exceeds the peak distance, a detection unit for detecting that the distance is less than the peak distance and that the distance exceeds the peak distance, a storage unit for storing first information which associates the distance with the level value in a distance range less than the peak distance, and second information which associates the distance with the level value in a distance range exceeding the peak distance, a distance acquisition unit which causes the distance measuring sensor to output the measurement signal by operating the distance measuring sensor in order to detect a remaining quantity of the sheets placed on the tray, (i) acquires a distance that is associated with the level value obtained by the distance measuring sensor in the first information when the detection unit detects that the distance is less than the peak distance, and (ii) acquires a distance that is associated with the level value obtained by the distance measuring sensor in the second information when the detection unit detects that the distance exceeds the peak distance, and a remaining quantity detection unit for detecting a remaining quantity of the sheets by using the distance acquired by the distance acquisition unit.

The effect of this configuration is now explained taking the distance measuring sensor S1 as an example. With this configuration, as shown in FIG. 2, first information which associates the distance L of the vertical direction between the distance measuring sensor S1 and the face (upper face 334*a*) of the first tray 334 with the level value in the distance range less than the peak distance SL and second information which associates the distance L with the level value in the distance range exceeding the peak distance SL are prepared in advance. Subsequently, when the measurement signal is output by operating the distance measuring sensor S1 in order to detect the remaining quantity of the sheets SH placed on the first tray 334, (i) the distance associated with the level value obtained by the distance measuring sensor S1 in the first information is acquired if the distance L is less than the peak distance SL, and (ii) the distance associated with the level value obtained by the distance measuring sensor S1 in the second information is acquired if the distance L exceeds the peak distance SL.

Accordingly, even if the level values of the measurement signal output from the distance measuring sensor S1 are the same, it is possible to differentiate whether to position the first tray 334 in a distance range less than the peak distance SL or to position the first tray 334 in a distance range exceeding the peak distance SL. Since the distance measuring sensor S1 can thereby be disposed without having to give consideration to the minimum detection distance of the sensor S1, the degree of freedom of the positioning of the distance measuring sensor S1 can be improved.

(8) In the foregoing configuration (7), before the measurement signal is output from the distance measuring sensor, the distance acquisition unit preselects, based on detection results of the detection unit, the first information when the distance in the vertical direction between the distance measuring sensor and the face of the tray is less than the peak distance, and preselects the second information when it exceeds the peak distance, and, when the measurement signal is output, the distance acquisition unit acquires a distance associated with the level value obtained by the distance measuring sensor in the preselected information of either the first information or the second information.

This configuration is a modified example of the distance determination processing explained with reference to FIG. 8. According to the foregoing configuration, when the measurement signal is output from the distance measuring sensor S1, the distance acquisition unit 11 acquires the distance by using the preselected information of either the first information or the second information based on the detection result of the detection unit 50. Thus, the step S2 shown in FIG. 8 is no longer required. Accordingly, the detection speed of the remaining sheet quantity can be improved in comparison to the case (FIG. 8) of selecting either the first information or the second information based on the detection result of the detection unit 50 after the measurement signal is output from the distance measuring sensor S1.

(9) In the foregoing configuration (7), the detection unit is disposed at a standard position, which is a position separated by the peak distance from the distance measuring sensor in the vertical direction.

(10) In the foregoing configuration (9), the detection unit includes a switch that is disposed at the standard position, and is operated when the tray passes the standard position, and whether the distance is less than the peak distance or exceeds the peak distance is indicated by an ON/OFF state of the switch.

According to the foregoing configuration, the effect of the foregoing configuration (2) can be yielded.

(11) In the foregoing configuration (9), the detection unit includes a light-emitting part, a light-receiving part for receiving light from the light-emitting part, and a light shielding member which is provided to the tray, shields the light between the light-emitting part and the light-receiving part if the tray is positioned at one position of either a position below the standard position or a position above the standard position, and does not shield the light between the light-emitting part and the light-receiving part if the tray is positioned at the other position.

This configuration corresponds to the device for detecting the remaining quantity of the sheets housed in the stocker 33 shown in FIG. 7. The effect is now explained taking the distance measuring sensor S1 as an example. According to the foregoing configuration, the light shielding member 70A is provided to the first tray 334 so that it shields the light between the light-emitting part S51 and the light-receiving part S52 if the first tray 334 is positioned at one position of either a position below the standard position SP or a position above the standard position SP, and so that it does not shield the light between the light-emitting part S51 and the light-receiving part S52 if the first tray 334 is positioned at the other position. Accordingly, the state where the distance L of the vertical direction between the distance measuring sensor S1 and the face (upper face 334*a*) of the first tray 334 is less than the peak distance SL and the state where it exceeds the peak distance SL can be detected with a single light shielding sensor S5 (detection unit) without having to provide two light shielding sensors.

(12) In the foregoing configuration (11), the light shielding member is provided to the tray so as to shield the light between the light-emitting part and the light-receiving part if the tray is positioned such that the distance becomes less than the peak distance.

As shown in FIG. 4, this configuration uses the fact that, in the distance of the object to be measured, a case where the distance L of the vertical direction between the distance measuring sensor S1 and the face (upper face 334*a*) of the first tray 334 is less than the peak distance SL is shorter in comparison to a case where it exceeds the peak distance SL. As shown in FIG. 7, this configuration corresponds to the example where the upper end of the light shielding member 70A is mounted on the side face of the first tray 334 and the lower end of the light shielding member 70A extending downward. The dimension from the upper end to the lower end of the light shielding member 70A is the same as the peak distance SL. According to the foregoing configuration, when the first tray 334 is located at a position where the distance L of the vertical direction between the distance measuring sensor S1 and the first tray 334 exceeds the peak distance SL, the size of the light shielding member 70A in the vertical direction can be reduced in comparison to the example where the light shielding member 70A is provided to the first tray 334 so as to shield the light between the light-emitting part S51 and the light-receiving part S52.

(13) In the foregoing configuration (9), the remaining sheet quantity detection device further includes a standard position acquisition unit for acquiring the standard position, and the tray is configured to move from one position of either a lower limit position or an upper limit position of the tray to the other position, and the standard position acquisition unit measures a time from the start of movement of the tray until the peak value is obtained while causing the distance measuring sensor to output the measurement signal by operating the distance measuring sensor, and acquires the standard position by using the time thus measured.

According to the foregoing configuration, the effect of the foregoing configuration (3) can be yielded.

(14) In the foregoing configuration (13), the remaining sheet quantity detection device further includes a notification unit for providing notification of the standard position acquired by the standard position acquisition unit.

According to the foregoing configuration, the effect of the foregoing configuration (4) can be yielded.

This application is based on Japanese Patent application No. 2010-123062 filed in Japan Patent Office on May 28, 2010, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A remaining sheet quantity detection device, comprising:

a sheet housing part for housing sheets;

a tray which is provided for placing the sheets and is movable in a vertical direction within the sheet housing part;

a motor for moving the tray in the vertical direction;

a distance measuring sensor which is provided opposite to an upper face of the tray, outputs a measurement signal indicating a vertical distance between the distance measuring sensor and the upper face of the tray as a voltage value, and has output characteristics where the voltage value becomes a peak value when the vertical distance between the distance measuring sensor and the upper face of the tray is a predetermined peak distance, the voltage value sequentially increases as the vertical distance between the distance measuring sensor and the upper face of the tray increases when the vertical distance between the distance measuring sensor and the upper face of the tray is less than the peak distance, and the voltage value sequentially decreases as the vertical distance between the distance measuring sensor and the upper face of the tray increases when the vertical distance between the distance measuring sensor and the upper face of the tray exceeds the peak distance;

a detection unit for detecting that the vertical distance between the distance measuring sensor and the upper face of the tray is less than the peak distance and that the vertical distance between the distance measuring sensor and the upper face of the tray exceeds the peak distance;

a storage unit for storing first information which associates the vertical distance between the distance measuring sensor and the upper face of the tray with the voltage value in a distance range less than the peak distance, and second information which associates the vertical distance between the distance measuring sensor and the upper face of the tray with the voltage value in a distance range exceeding the peak distance;

a distance acquisition unit for acquiring a vertical distance between the distance measuring sensor and the upper face of the tray that is associated with the voltage value obtained by the distance measuring sensor in the first information when the detection unit detects that the vertical distance between the distance measuring sensor and the upper face of the tray is less than the peak distance, and acquiring a vertical distance between the distance measuring sensor and the upper face of the tray that is associated with the voltage value obtained by the distance measuring sensor in the second information when the detection unit detects that the vertical distance between the distance measuring sensor and the upper face of the tray exceeds the peak distance; and a remaining quantity detection unit for detecting a remaining quantity of the sheets by using the vertical distance between the distance measuring sensor and the upper face of the tray acquired by the distance acquisition unit.

2. The remaining sheet quantity detection device according to claim 1, wherein the detection unit includes a switch that is disposed at a standard position, which is a position separated by the peak distance from the distance measuring sensor in the vertical direction, the switch being operated when the tray passes the standard position, and whether the vertical distance between the distance measuring sensor and the upper face of the tray is less than the peak distance or exceeds the peak distance is indicated by an ON/OFF state of the switch.

3. The remaining sheet quantity detection device according to claim 2, wherein the sheet housing part is provided with a plurality of graduation marks between a bottom part of the sheet housing part and the distance measuring sensor in the moving direction of the tray.

4. The remaining sheet quantity detection device according to claim 2, further comprising:

a standard position acquisition unit for acquiring the standard position, wherein the standard position acquisition unit drives the motor to move the tray from a lowermost position that is pre-set within the sheet housing part to an uppermost position that is pre-set within the sheet housing part at a pre-set speed, measures a time from the start of this movement until the peak value is obtained by the distance measuring sensor, and acquires the standard position by using the time thus measured.

5. The remaining sheet quantity detection device according to claim 4, further comprising a notification unit for providing notification of the standard position acquired by the standard position acquisition unit.

6. An image forming apparatus, comprising:

a remaining sheet quantity detection device having:

a sheet housing part for housing sheets;

a tray which is provided for placing the sheets and is movable in a vertical direction within the sheet housing part;

a motor for moving the tray in the vertical direction;

a distance measuring sensor which is provided opposite to an upper face of the tray, outputs a measurement signal indicating a vertical distance between the distance measuring sensor and the upper face of the tray as a voltage value, and has output characteristics where the voltage value becomes a peak value when the vertical distance between the distance measuring sensor and the upper face of the tray is a predetermined peak distance, the voltage value sequentially increases as the vertical distance between the distance measuring sensor and the upper face of the tray increases when the vertical distance between the distance measuring sensor and the upper face of the tray is less than the peak distance, and the voltage value sequentially decreases as the vertical distance between the distance measuring sensor and the upper face of the tray increases when the vertical distance between the distance measuring sensor and the upper face of the tray exceeds the peak distance;

a detection unit for detecting that the vertical distance between the distance measuring sensor and the upper face of the tray is less than the peak distance and that the vertical distance between the distance measuring sensor and the upper face of the tray exceeds the peak distance;

a storage unit for storing first information which associates the vertical distance between the distance measuring sensor and the upper face of the tray with the voltage value in a distance range less than the peak distance, and second information which associates the vertical distance between the distance measuring sensor and the upper face of the tray with the voltage value in a distance range exceeding the peak distance;

a distance acquisition unit for acquiring a vertical distance between the distance measuring sensor and the upper face of the tray that is associated with the voltage value obtained by the distance measuring sensor in the first information when the detection unit detects that the vertical distance between the distance measuring sensor and the upper face of the tray is less than the peak distance, and acquiring a vertical distance between the distance measuring sensor and the upper face of the tray that is associated with the voltage value obtained by the distance measuring sensor in the second information when the detection unit detects that the vertical distance between the distance measuring sensor and the upper face of the tray exceeds the peak distance; and a remaining quantity detection unit for detecting a remaining quantity of the sheets by using the vertical distance between the distance measuring sensor and the upper face of the tray acquired by the distance acquisition unit;

a conveyer unit for picking up and conveying the sheets housed in the sheet housing part; and an image forming unit for forming an image on the sheet conveyed by the conveyer unit.

7. A remaining sheet quantity detection device for detecting a remaining quantity of sheets placed on a tray which is moved in an upward direction as the remaining quantity of the sheets decreases, comprising:

a distance measuring sensor which is provided opposite to a face of the tray, outputs a measurement signal indicating a vertical distance between the distance measuring sensor and the face of the tray as a voltage value, and has output characteristics where the voltage value increases as the vertical distance between the distance measuring sensor and the face of the tray increases when the distance is less than a peak distance which is the vertical distance between the distance measuring sensor and the face of the tray where the voltage value becomes a peak value, and the level value decreases as the vertical distance between the distance measuring sensor and the face of the tray increases when the vertical distance between the distance measuring sensor and the face of the tray exceeds the peak distance;

a detection unit for detecting that the vertical distance between the distance measuring sensor and the face of the tray is less than the peak distance and that the vertical distance between the distance measuring sensor and the face of the tray exceeds the peak distance;

a storage unit for storing first information which associates the vertical distance between the distance measuring sensor and the face of the tray with the voltage value in a distance range less than the peak distance, and second information which associates the vertical distance between the distance measuring sensor and the face of the tray with the voltage value in a distance range exceeding the peak distance;

a distance acquisition unit which causes the distance measuring sensor to output the measurement signal by operating the distance measuring sensor in order to detect a remaining quantity of the sheets placed on the tray, (i) acquires a vertical distance between the distance measuring sensor and the face of the tray that is associated with the voltage value obtained by the distance measuring sensor in the first information when the detection unit detects that the vertical distance between the distance measuring sensor and the face of the tray is less than the peak distance, and (ii) acquires a vertical distance between the distance measuring sensor and the face of the tray that is associated with the voltage value obtained by the distance measuring sensor in the second information when the detection unit detects that the vertical distance between the distance measuring sensor and the face of the tray exceeds the peak distance; and a remaining quantity detection unit for detecting a remaining quantity of the sheets by using the vertical distance between the distance measuring sensor and the face of the tray acquired by the distance acquisition unit.

8. The remaining sheet quantity detection device according to claim 7, wherein, before the measurement signal is output from the distance measuring sensor, the distance acquisition unit preselects, based on detection results of the detection unit, the first information when the vertical distance between the distance measuring sensor and the face of the tray is less than the peak distance, and preselects the second information when the vertical distance between the distance measuring sensor and the face of the tray exceeds the peak distance, and, when the measurement signal is output, the distance acquisition unit acquires a vertical distance between the distance measuring sensor and the face of the tray associated with the voltage value obtained by the distance measuring sensor in the preselected information of either the first information or the second information.

9. The remaining sheet quantity detection device according to claim 7, wherein the detection unit is disposed at a standard position, which is a position separated by the peak distance from the distance measuring sensor in the vertical direction.

10. The remaining sheet quantity detection device according to claim 9, wherein the detection unit includes a switch that is disposed at the standard position, and is operated when the tray passes the standard position, and whether the vertical distance between the distance measuring sensor and the face of the tray is less than the peak distance or exceeds the peak distance is indicated by an ON/OFF state of the switch.

11. The remaining sheet quantity detection device according to claim 9, wherein the detection unit includes:

a light-emitting part;

a light-receiving part for receiving light from the light-emitting part; and a light shielding member which is provided to the tray, shields the light between the light-emitting part and the light-receiving part if the tray is positioned at one position of either a position below the standard position or a position above the standard position, and does not shield the light between the light-emitting part and the light-receiving part if the tray is positioned at the other position.

12. The remaining sheet quantity detection device according to claim 11, wherein the light shielding member is provided to the tray so as to shield the light between the light-emitting part and the light-receiving part if the tray is positioned such that the vertical distance between the distance measuring sensor and the face of the tray becomes less than the peak distance.

13. The remaining sheet quantity detection device according to claim 9, further comprising:

a standard position acquisition unit for acquiring the standard position, wherein the tray is configured to move from one position of either a lower limit position or an upper limit position of the tray to the other position, and the standard position acquisition unit measures a time from the start of movement of the tray until the peak value is obtained while causing the distance measuring sensor to output the measurement signal by operating the distance measuring sensor, and acquires the standard position by using the time thus measured.

14. The remaining sheet quantity detection device according to claim 13, further comprising a notification unit for providing notification of the standard position acquired by the standard position acquisition unit.

* * * * *